(12) United States Patent  (10) Patent No.: US 6,700,830 B2
Wada  (45) Date of Patent: Mar. 2, 2004

(54) SEMICONDUCTOR INTEGRATED CIRCUIT

(75) Inventor: Osamu Wada, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/235,488

(22) Filed: Sep. 6, 2002

(65) Prior Publication Data

US 2003/0053363 A1 Mar. 20, 2003

(30) Foreign Application Priority Data

Sep. 17, 2001 (JP) ........................................ 2001-281398

(51) Int. Cl.⁷ ................................................. G11C 7/00

(52) U.S. Cl. ........................................ 365/226; 365/229

(58) Field of Search ................... 365/226, 229

(56) References Cited

U.S. PATENT DOCUMENTS 5,825,648 A * 10/1998 Karnowski ................... 700/82
6,256,252 B1     7/2001 Arimoto ........................ 365/227

* cited by examiner

*Primary Examiner*—Michael Tran
(74) *Attorney, Agent, or Firm*—Oblon, Spivak, McClelland, Maier & Neustadt, P.C.

(57) ABSTRACT

A semiconductor integrated circuit comprises an internal potential generation circuit for a memory, a current flow pass interruption circuit connected to the internal potential generation circuit, and an input terminal, connected to the current flow pass interruption circuit, for providing a stand-by setting signal controlling the current flow pass interruption circuit, wherein a potential is supplied to the internal potential generation circuit during the operation of the memory, and it is interrupted during the stand-by of the memory to supply the potential to the internal potential generation circuit.

22 Claims, 7 Drawing Sheets

SEMICONDUCTOR INTEGRATED CIRCUIT

CROSS-REFERENCE TO RELATED APPLICATIONS

This application is based upon and claims the benefit of priority from the prior Japanese Patent Application No. 2001-281398, filed Sep. 17, 2001, the entire contents of which are incorporated herein by reference.

BACKGROUND OF THE INVENTION

1. Field of the Invention

The present invention relates to a semiconductor integrated circuit, and more particularly, it relates to a circuit configuration which reduces a stand-by current in a memory-embedded logic LSI.

2. Description of the Related Art

Heretofore, chips have been constituted separately in accordance with several functions, but a semiconductor integrated circuit called a system LSI (large scale integrated circuit) in which the functions are integrated into one chip has become important. Of the system LSIs, a memory-embedded logic LSI in which a memory circuit is embedded into a logic LSI has particularly been drawing attention and recently developed.

This kind of memory-embedded logic LSI is applied to a digital civil-use appliance such as a portable appliance, a mobile product, and so it has an important theme of reducing power dissipation in its use.

Needless to say, it is important that the memory-embedded logic LSI is low in power dissipation during its use, but in addition, it is also important to reduce stand-by power dissipation, to which much attention has recently been paid.

FIG. 5 is a block diagram showing a conventional memory-embedded logic LSI 501, which is divided into a logic unit 502 and a memory macro 503. Furthermore, the memory macro 503 includes therein an internal potential generation circuit group 504 which is used for the memory macro 503.

A stand-by current of the memory macro 503 is mainly dissipated by the internal potential generation circuit group 504, which generates a potential used in the memory macro 503. The internal potential generation circuit group 504 is comprised of a word line drive internal step-up circuit 508 used as an internal power supply of the memory macro 503, an internal step-down potential generation circuit 509, a substrate potential generation circuit 512 for feeding a substrate potential and a well potential, a reference potential generation circuit 507 used as an internal reference potential, and the like.

The word line drive internal step-up circuit 508 is used, for example, as a power supply for driving a word line or a power supply for driving a gate signal of a transistor which controls an interconnection between a pair of a sense-amplifier and a bit line in a shared sense-amplification system.

The internal step-down potential generation circuit 509 is used as a power supply for generating a voltage lower than an external power supply voltage in the memory macro 503 thereby to pre-charge a bit line, or as a power supply for feeding a plate potential for a memory cell.

The reference potential generation circuit 507 is a circuit for generating a reference potential for potentials generated by the other internal voltage generation circuits, and as the reference potential generation circuit 507, there is used a circuit having a low temperature dependency and external voltage dependency.

Upon application of power, the internal potential generation circuit group 504 generates, for a certain time, a reset signal which initializes an internal circuit (not shown) in the memory macro 503, for example, a flip-flop, a latch, a register, etc., and it is possible that each internal potential is generated according to a signal which keeps a certain potential level at an operating voltage by an external voltage and which is output from an external power supply voltage detection circuit 506. Therefore, the internal potential generation circuit group 504 is controlled by a power-on sequence control circuit 505 so as to prevent the occurrence of latch-up and the like during the generation of the internal potentials.

In the memory macro 503 of the conventional memory-embedded logic LSI 501, however, the internal potential generation circuit group 504 uses therein a number of comparators and resistors for controlling their respective potentials at predetermined levels, so that these circuits always consume a current of a few tens of micro-amperes in a state where the internal potential can be generated. This electric current increases the current consumption during the stand-by. Conventionally, to suppress the stand-by current consumption of the memory macro 503, there has been no way but to turn off the external power supply fed to the memory macro 503, in which case the operations of the logic circuit 502 have all been stopped except the memory macro 503.

BRIEF SUMMARY OF THE INVENTION

A first aspect of the present invention, there is provided a semiconductor integrated circuit which comprises an internal potential generation circuit for a memory; a current flow pass interruption circuit connected to the internal potential generation circuit; and an input terminal, connected to the current flow pass interruption circuit, for providing a stand-by setting signal controlling the current flow pass interruption circuit, wherein a potential is supplied to the internal potential generation circuit during the operation of the memory, and it is interrupted during the stand-by of the memory to supply the potential to the internal potential generation circuit.

A second aspect of the present invention, there is provided a semiconductor integrated circuit which comprises a plurality of internal potential generation circuits for a memory; a current flow pass interruption circuit connected to each of the plurality of internal potential generation circuits; and an input terminal connected to each of the current flow pass interruption circuits, for providing a stand-by setting signal to control the current flow pass interruption circuits, wherein a potential is supplied to the plurality of internal potential generation circuits during the operation of the memory, and it is interrupted during the stand-by of the memory to supply the potential to the plurality of internal potential generation circuits.

A third aspect of the present invention, there is provided a semiconductor integrated circuit which comprises an internal potential generation circuit for a memory; a current flow pass interruption circuit connected to the internal potential generation circuit; a power-on sequence control circuit connected to the internal potential generation circuit; an external power supply voltage detection circuit for detecting an external power supply to output a detection signal; an LPM reset circuit connected to the external power supply voltage detection circuit, the power-on sequence control circuit and the internal potential generation circuit, respectively; and an input terminal connected to the LPM reset circuit, wherein an LPM reset signal is produced in the LPM reset circuit by at least two signals selected from the group consisting of the detection signal, a stand-by setting signal input from the input terminal and a signal output from the power-on sequence control circuit and specifying an operable state of the memory, and in accordance with the LPM reset signal, a potential is supplied from a power supply to the internal potential generation circuit during the operation of the memory and it is interrupted during the stand-by of the memory to supply the potential from the power supply to the internal potential generation circuit.

DETAILED DESCRIPTION OF THE INVENTION

Figure 1:
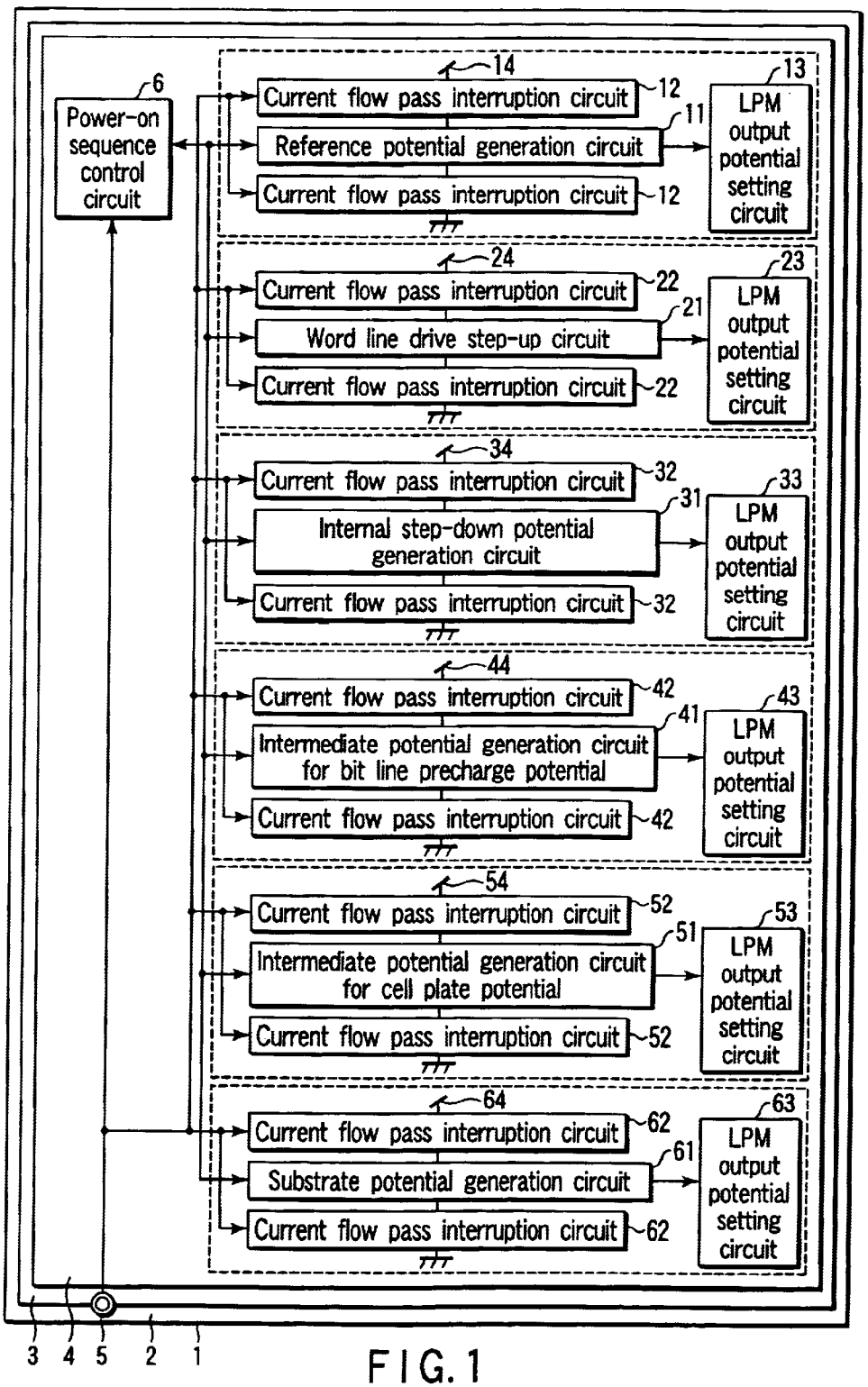
FIG. 1 is a block diagram for showing a memory-embedded logic LSI according to a first embodiment.

FIG. 1 shows a block diagram of a memory-embedded logic LSI according to the first embodiment.

A memory-embedded logic LSI 1 comprises a block of a logic circuit 2 including a peripheral circuit etc. and a block of a dynamic random access memory macro (hereinafter abbreviated as "memory macro") 3.

An internal potential generation circuit group 4 for generating potentials used in the memory macro 3 includes a reference potential generation circuit 11, a word line drive step-up circuit 21, an internal step-down potential generation circuit 31, an intermediate potential generation circuit 41 for bit line pre-charge potential, an intermediate potential generation circuit 51 for cell plate potential, and a substrate potential generation circuit 61.

These internal potential generation circuits such as the reference potential generation circuit 11 etc. are directly connected with an LPM (Low Power Mode) setting input terminal 5.

Furthermore, this LPM setting input terminal 5 is connected to a power-on sequence control circuit 6, which is in turn connected to the various internal potential generation circuits.

Furthermore, the internal potential generation circuits are each connected with two current flow pass interruption circuits, one of which is connected with a power supply, for example, an external power supply.

That is, the reference potential generation circuit 11 is connected with a first current flow pass interruption circuit 12 connected to a power supply line 14, to be grounded through a second current flow pass interruption circuit 12 connected to the reference potential generation circuit 11. Furthermore, an output of the reference potential generation circuit 11 is configured to be applied to an LPM potential setting circuit 13 so that these may make up one circuit unit as defined by a dotted line in the figure.

Similarly, a word line drive step-up circuit 21, an internal step-down potential generation circuit 31, an intermediate potential generation circuit 41 for bit line pre-charge potential, an intermediate potential generation circuit 51 for cell plate potential, and a substrate potential generation circuit 61 each have the first and second current flow pass interruption circuits connected between power supply lines 24, 34, 44, 54, and 64 and the ground respectively.

The following will describe the operations for setting and releasing of a stand-by state of the memory macro 3 of the memory-embedded logic LSI1 shown in FIG. 1.

Here, the stand-by state of the memory macro 3 is a state where the supply of the potentials generated in the memory macro 3 is interrupted to disable reading/writing and holding of data stored in the memory cells of the memory macro 3. In the stand-by state, therefore, no internal current flows through the memory macro 3, thus enabling greatly reducing a power dissipation as compared to a conventional stand-by state based on the assumption of holding the data in the memory macro 3. Hereinafter, this stand-by state is referred to as an LPM (Low Power Mode).

To set the LPM, a Low Power Mode setting signal (hereinafter called "LPM setting signal") is input from the LPM setting input terminal 5 to each of the internal potential generation circuits such as the reference potential generation circuit 11 etc. thereby to interrupt the current flow pass interruption circuit for each of the internal potential generation circuits in order to interrupt the current flow passes.

To release the LPM, on the other hand, a Low Power Mode releasing signal (hereinafter called "LPM releasing signal") is input from the LPM setting input terminal 5 to the current flow pass interruption circuit thereby to make conductive the current flow pass interrupted to each of the internal potential generation circuits. Specifically, when the LPM releasing signal is input to the power-on sequence control circuit 6, the power-on sequence control similar to that for power application is carried out, thus returning each of the internal potential generation circuits to its ordinary operation state. That is, when many of the circuits in the memory macro 3 are being driven at, for example, an internal step-down potential, these circuits are destabilized upon setting of the LPM, so that to release the LPM it is necessary to conduct the control similar to that for power application, thereby to activate the internal step-down potential generation circuit 31 and to initialize the internal signal.

For example, when the internal power supply is controlled upon power application, the reference potential generation circuit 11 is activated in order to suppress latch-up or a flow pass current and the internal step-down potential generation circuit 31 is started up to activate the substrate potential generation circuit 61. Subsequently, the intermediate potential generation circuit 51 for cell plate potential, the intermediate potential generation circuit 41 for bit line pre-charge potential, the word line drive step-up potential generation circuit 21, and the latch circuit are initialized, and when the potentials are all increased to such a level as to enable the operation of the memory macro 3, a signal specifying the operation-ready state (hereinafter called "CHRDYp signal") is output, thereby carrying out the power-on sequence control.

For releasing the LPM of the memory macro 3, therefore, the same control as the power-on sequence control is conducted, so that when LPM releasing signal is input from the LPM setting input terminal 5, the activation signal and the internal signal of each of the internal potential generation circuits are initialized through the power-on sequence control circuit 6.

The following will describe each of the internal potential generation circuits of the memory macro 3 shown in FIG. 1.

The word line drive step-up circuit 21 is connected to a power supply 24 through a current flow pass interruption circuit 22, which is connected to the LPM setting input terminal 5 through the power-on sequence control circuit 6.

The word line drive step-up circuit 21 is provided with a current flow pass including a comparator for controlling an output potential of the step-up circuit at a predetermined level and a resistance type voltage divider circuit for detecting a step-up potential. Conventionally, these comparator and resistance type voltage divider circuit have been operating always as far as external power is applied thereto, thus inevitably dissipating a current flowing therethrough. According to the present embodiment, on the other hand, the word line drive step-up circuit 21 is stopped in operation in the LPM. That is, the LPM setting signal is input from the LPM setting input terminal 5 to the current flow pass interruption circuit 22 to interrupt the supply of a potential to the word line drive step-up circuit 21. It is to be noted that when the LPM releasing signal is input from the LPM setting input terminal 5, the current flow pass interruption circuit 22 interrupted conducts thereby to apply the power supply to the word line drive step-up circuit 21.

Furthermore, the output of the word line drive step-up circuit 21 is connected to an LPM output potential setting circuit 23. This LPM output potential setting circuit 23 is comprised of a switching element etc. and has a function to primarily set the output potential of the word line drive step-up circuit 21 in the LPM. This output potential can be specifically set at a floating state, an external power supply potential or a potential obtained by subtracting a threshold value from it, an internal step-down potential or a potential obtained by subtracting a threshold value from it, or the ground potential.

Next, the intermediate potential generation circuit 41 for bit line pre-charge potential will be described as follows. The intermediate potential generation circuit 41 for bit line pre-charge potential is also supplied with power through a current flow pass interruption circuit 42, which is connected with the LPM setting input terminal 5.

As the intermediate potential generation circuit 41 for bit line pre-charge potential, so-called an intermediate potential generation circuit is employed. Using, for example, two comparators, there is used a circuit such that a MOS transistor connected between an output node and the ground potential is turned on to lower the potential when it is higher than a predetermined level and that a MOS transistor connected between the output node and a high potential is turned on to lower the potential when it is lower than a predetermined level. As in the case of the above-mentioned word line drive step-up circuit, in this case also, such a current flow pass including the comparators, the resistance type voltage divider circuit, etc is provided. Conventionally, these comparators and resistance type voltage divider circuit have always been operating as far as external power is applied thereto, thus inevitably consuming a current flowing therethrough. By the present embodiment, on the other hand, the intermediate potential generation circuit 41 for bit line pre-charge potential is stopped in operation in LPM. That is, the LPM setting signal is input from the LPM setting input terminal 5 to the current flow pass interruption circuit 42 thereby to interrupt the supply of a potential to the intermediate potential generation circuit 41 for bit line pre-charge potential. It is to be noted that when the LPM releasing signal is input from the LPM setting input terminal 5, the current flow pass interruption circuit 42 interrupted will conduct to supply the power to the intermediate potential generation circuit 41 for bit line pre-charge potential.

Furthermore, the output of the intermediate potential generation circuit 41 for bit line pre-charge potential is also connected to an LPM output potential setting circuit 43. An output potential of the intermediate potential generation circuit 41 for bit line pre-charge potential, therefore, can be specifically set at a floating state, an external power supply potential or a potential obtained by subtracting a threshold value from it, an internal step-down potential or a potential obtained by subtracting a threshold value from it, or the ground potential.

Next, the intermediate potential generation circuit for cell plate potential 51 will be described as follows. The intermediate potential generation circuit 51 for cell plate potential is also supplied with the power through a current flow pass interruption circuit 52, which is connected with the LPM setting input terminal 5.

The intermediate potential generation circuit 51 for cell plate potential is comprised of the same circuit as that of the intermediate potential generation circuit 41 for bit line pre-charge potential. In the intermediate potential generation circuit 51 for cell plate potential also, such a current flow pass is configured as to include the comparators, the resistance type voltage divider circuit, etc. Conventionally, these comparators and resistance type voltage divider circuit have always been operating as far as external power is applied thereto, thus inevitably consuming a current flowing therethrough. By the present embodiment, on the other hand, the intermediate potential generation circuit 51 for cell plate potential is stopped in operation in LPM. That is, the LPM setting signal is input from the LPM setting input terminal 5 to the current flow pass interruption circuit 52 thereby to interrupt the supply of a potential to the intermediate potential generation circuit 51 for cell plate potential. It is to be noted that when the LPM releasing signal is input from the LPM setting input terminal 5, the current flow pass interruption circuit 52 interrupted will conduct thereby to supply the power to the intermediate potential generation circuit 51 for cell plate potential.

Furthermore, the output of the intermediate potential generation circuit 51 for cell plate potential is also connected to an LPM output potential setting circuit 53. An output potential of the intermediate potential generation circuit 51 for cell plate potential, therefore, can be specifically set at a floating state, an external power supply potential or a potential obtained by subtracting a threshold value from it, an internal step-down potential or a potential obtained by subtracting a threshold value from it, or the ground potential.

Next, the substrate potential generation circuit 61 will be described as follows. The substrate potential generation circuit 61 is also supplied with the power through a current flow pass interruption circuit 62, which is connected to the LPM setting input terminal 5.

The substrate potential generation circuit 61 has a current flow pass including a comparator for controlling an output potential of the substrate potential generation circuit 61 at a predetermined potential and a resistance type voltage divider circuit used to detect a substrate potential. Conventionally, these comparator and resistance type voltage divider circuit have always been operating as far as external power is applied thereto, thus inevitably consuming a current flowing therethrough. By the present embodiment, on the other hand, the substrate potential generation circuit 61 is stopped in operation in LPM. That is, the LPM setting signal is input from the LPM setting input terminal 5 to the substrate potential generation circuit 61 thereby to interrupt the supply of a potential to the substrate potential generation circuit 61. It is to be noted that when the LPM releasing signal is input from the LPM setting input terminal 5, the current flow pass interruption circuit 62 interrupted will conduct to supply the power to the substrate potential generation circuit 61.

Furthermore, the output of the substrate potential generation circuit 61 is also connected to an LPM output potential setting circuit 63. The output setting potential of the substrate potential generation circuit 61, therefore, can be specifically set at a floating state or the ground potential.

Since the reference potential generation circuit 11 and the internal step-down potential generation circuit 31 have also such a current flow pass configured therein as to include the comparator and the resistance type voltage divider circuit, they can be set in the LPM by providing the current flow pass interruption circuit 12 and an LPM output potential setting circuit 13 as in the case of the above-mentioned potential generation circuits.

It is, therefore, possible to obtain a remarkable current reduction effect by combining the interruption of the current flow pass of each internal potential generation circuit.

Further, when a potential is applied to each of the internal potential generation circuits through one current flow pass interruption circuit, the current flow pass interruption circuit needs to use an element that has a very high drive capacity, thus increasing the circuit scale. As in the present embodiment, on the contrary, each of the internal potential generation circuits is provided with each current flow pass interruption circuit, thus decreasing the circuit scale.

Figure 2:
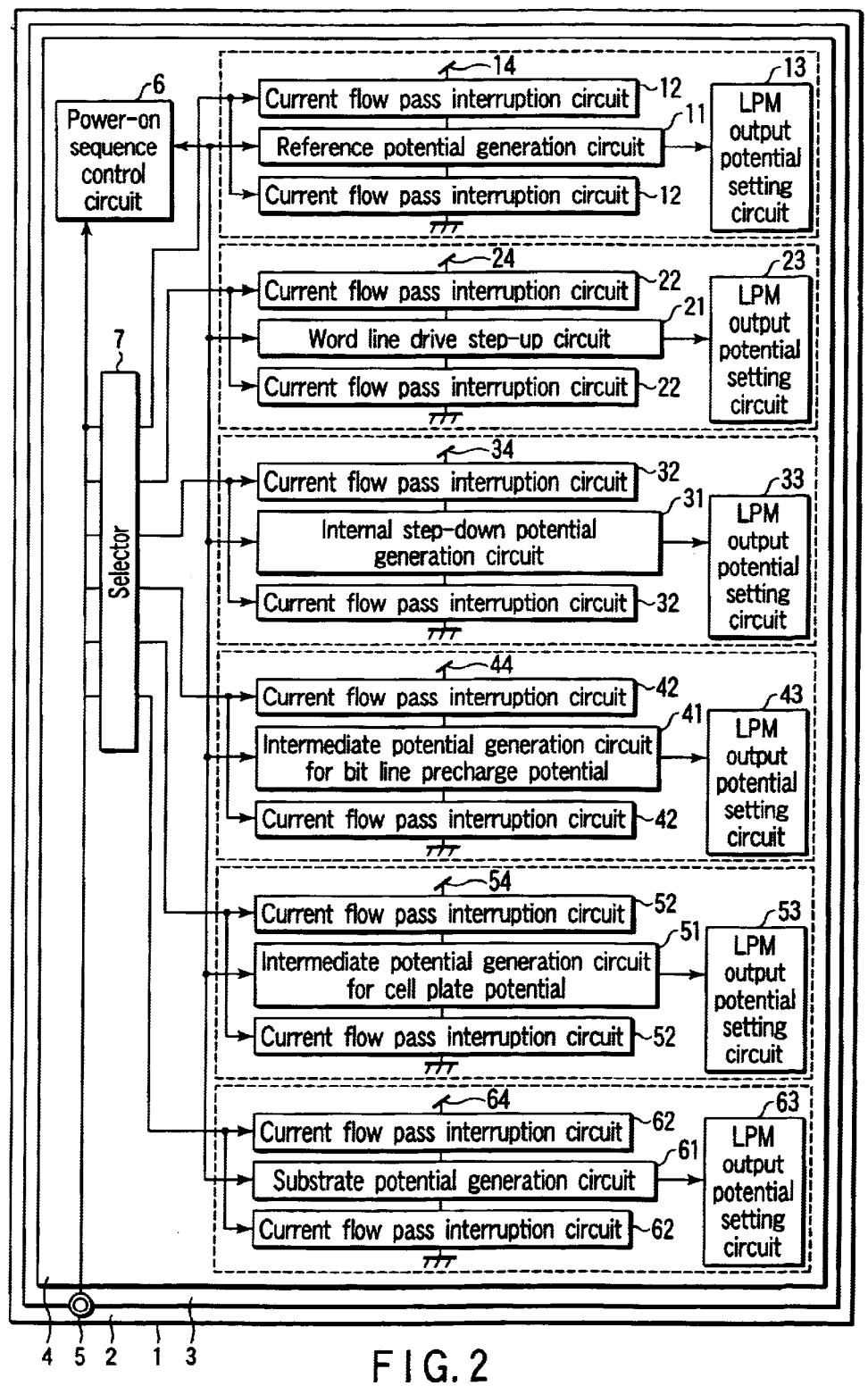
FIG. 2 is a block diagram for showing an application example of the memory-embedded logic LSI according to the first embodiment.

FIG. 2 shows an application example of the present embodiment.

In this application example, a selector 7 is inserted between the LPM setting input terminal 5 and each of the internal potential generation circuits. The other components are the same as those of the first embodiment and so their explanation is omitted. The LPM setting or releasing signal is input to the selector 7 from the LPM setting input terminal 5. This selector 7 makes it possible to interrupt or make conductive the current flow pass of only selected one of the plurality of internal potential generation circuits.

Figure 3A:
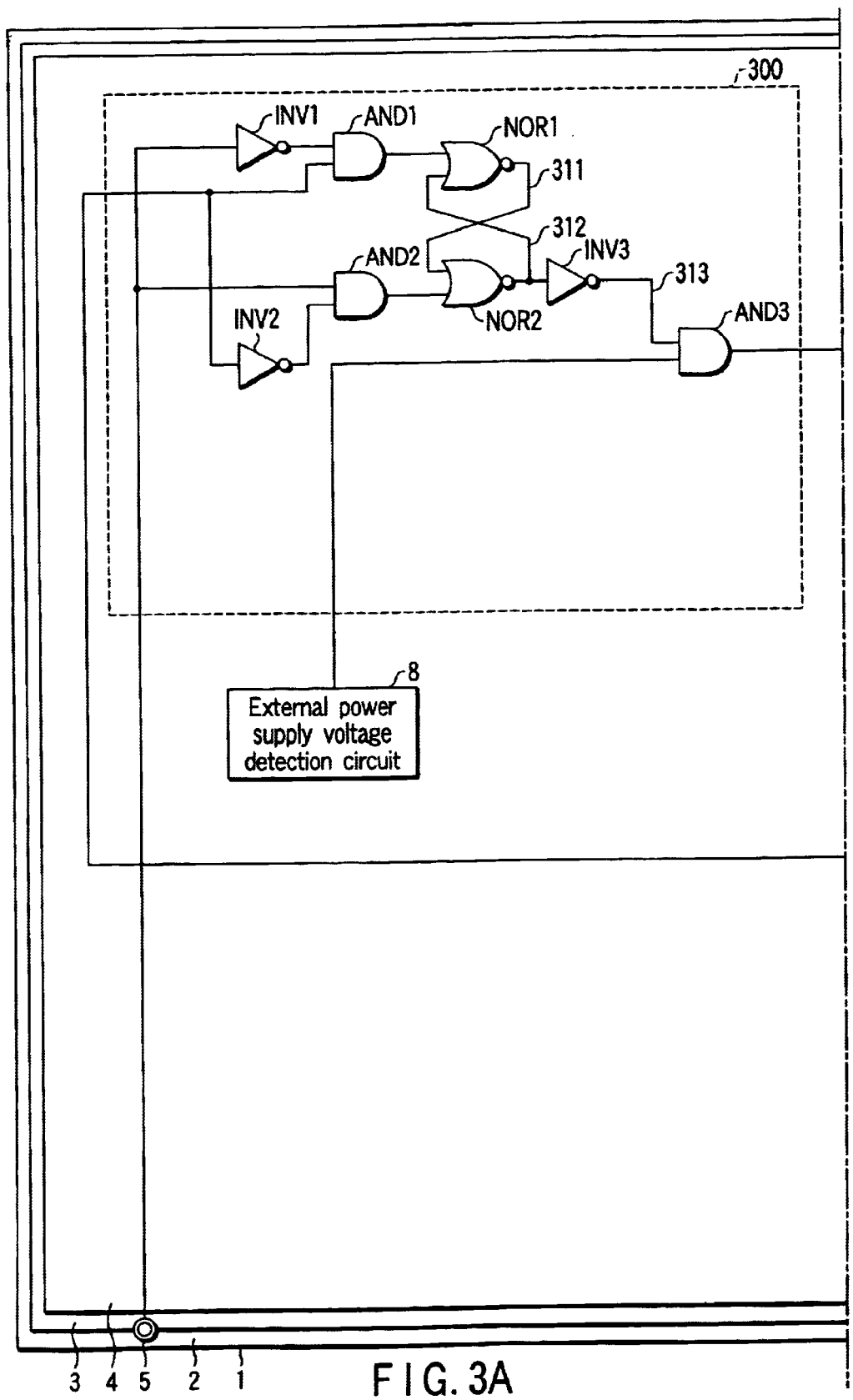
FIGS. 3A and 3B are block diagrams for showing a memory-embedded logic LSI according to a second embodiment.
Figure 3B:
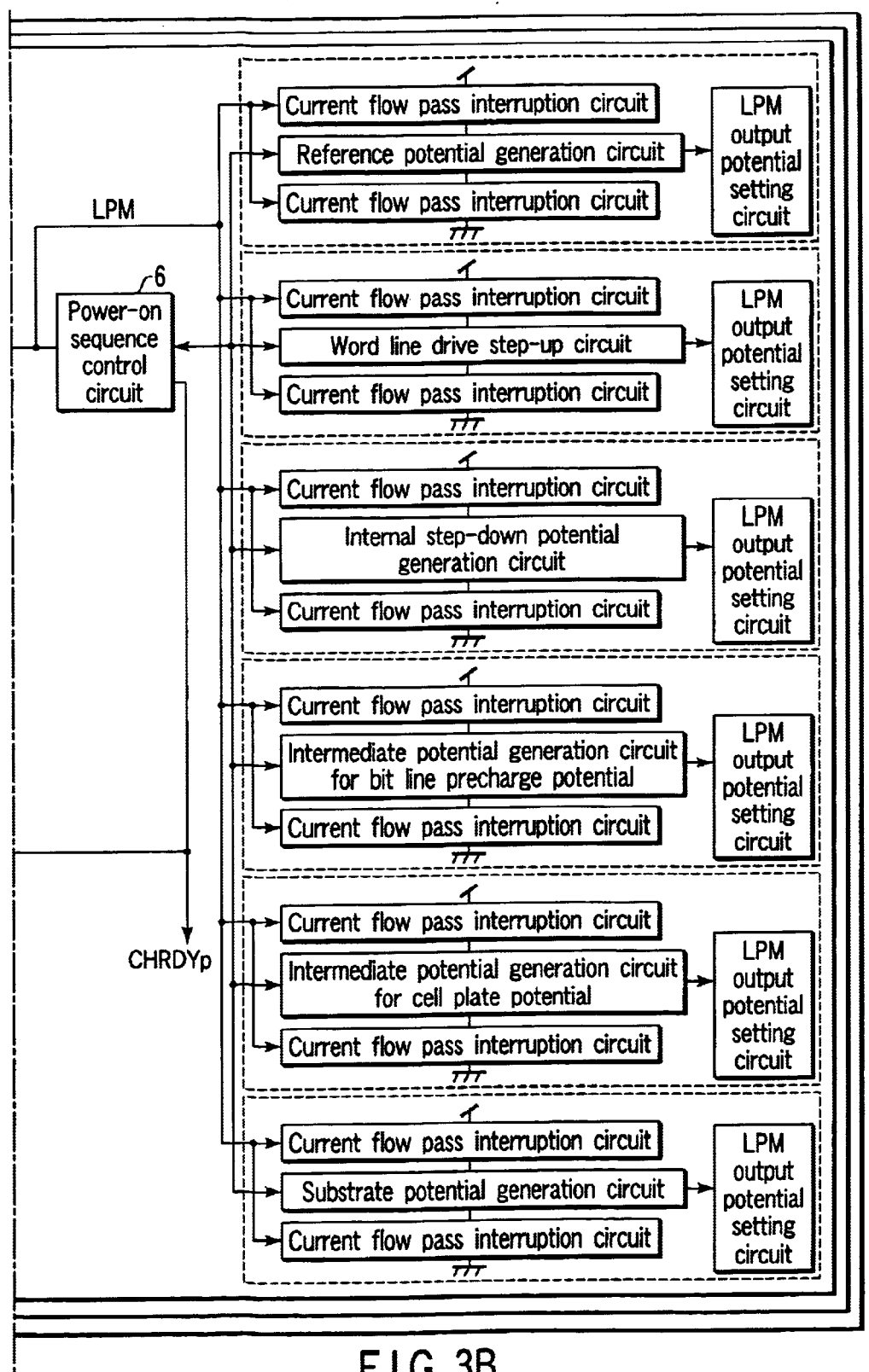

Next, FIGS. 3A and 3B show block diagrams for showing a memory-embedded logic LSI according to the second embodiment.

The second embodiment has an LPM reset circuit 300 added to the configuration of the first embodiment shown in FIG. 1.

The LPM reset circuit 300 is connected to the LPM setting input terminal 5, an external power supply voltage detection circuit 8, the internal potential generation circuits in the memory macro 3 including the reference potential generation circuit 11, and the power-on sequence circuit 6. The LPM reset circuit 300 receives as an input signal the LPM signal (LPM setting or releasing signal) input from the LPM setting input terminal 5, the detection signal output from an external power supply voltage detection circuit 8, and the CHRDYp signal output from the power-on sequence control circuit 6, thereby to output an LPM reset signal, which is input to each of the internal potential generation circuit and the power-on sequence control circuit 6.

In LPM reset circuit 300, an inverted signal of the LPM signal and the CHRDYp signal are connected to AND1, while the LPM signal and an inverted signal of the CHRDYp signal are connected to AND2. An output of AND1 is connected to NOR1 of a latch circuit, while an output of AND2 is connected to NOR2. An inverted signal of an output of NOR2 and an output signal of the external power supply voltage detection circuit 8 are connected to AND3. An output of AND3 provides the LPM reset signal and is input to the power-on sequence control circuit 6 and each of the internal potential generation circuits.

Next, the operations of the LPM reset circuit 300 are described as divided into those upon power application and those when a signal that specifies the setting of the LPM is input.

In the present embodiment, the signal level for specifying the release of the LPM is given by HIGH in level and the signal level for specifying the setting of the LPM is given by LOW in level.

When external power is applied, the external power supply voltage detection circuit 8 is activated, which then detects and outputs a signal having the same level as that of an external voltage if it exceeds a constant voltage level. In this case, the LPM signal is fixed at the HIGH level. If the external power supply voltage detection circuit 8 detects an external voltage, that is, if it provides the HIGH level, it is output to AND3 of the LPM reset circuit 300. In this case, upon power application, in the LPM rest circuit 300, AND1 provides the LOW level and AND2 provides the HIGH level because the memory macro CHRDYp signal is LOW in level and the LPM signal is HIGH in level. Accordingly, an output of the latch circuit of NOR1 and NOR2 is inverted and a signal node 313 becomes HIGH in level, which is input to one of the two inputs of AND3. Therefore, AND3 receives the HIGH level at both inputs thereof to provide the HIGH level, so that the LPM reset circuit applies the release-specifying signal to the power-on sequence control circuit 6 and each of the internal potential generation circuits.

The following will describe the operation for specifying the setting of the LPM.

When the LPM is set, the memory macro 3 is in the operable state, so that the external power supply voltage detection circuit 8 is HIGH in level and the CHRDYp signal is also HIGH in level. When the LPM of the LOW level is input, AND1 provides the HIGH level output, and AND2 outputs the LOW level. Therefore, the output of the latch circuit of NOR1 and NOR2 is inverted and the signal node 313 becomes LOW in level, which is applied to one of the two inputs of AND3. Then, AND3 provides the LOW level, so that the LPM reset signal specifies the setting of the LPM, that is, it has the LOW level, which is input to the power-on sequence control circuit 6 and each of the internal potential generation circuits thereby to interrupt the current flow pass for each of the internal potential generation circuits.

It is to be noted that even if the LPM signal becomes HIGH in level owing to chattering, noise, etc. during the setting of the LPM, it has no influence until the internal potential is stabilized in state.

Figure 4A:
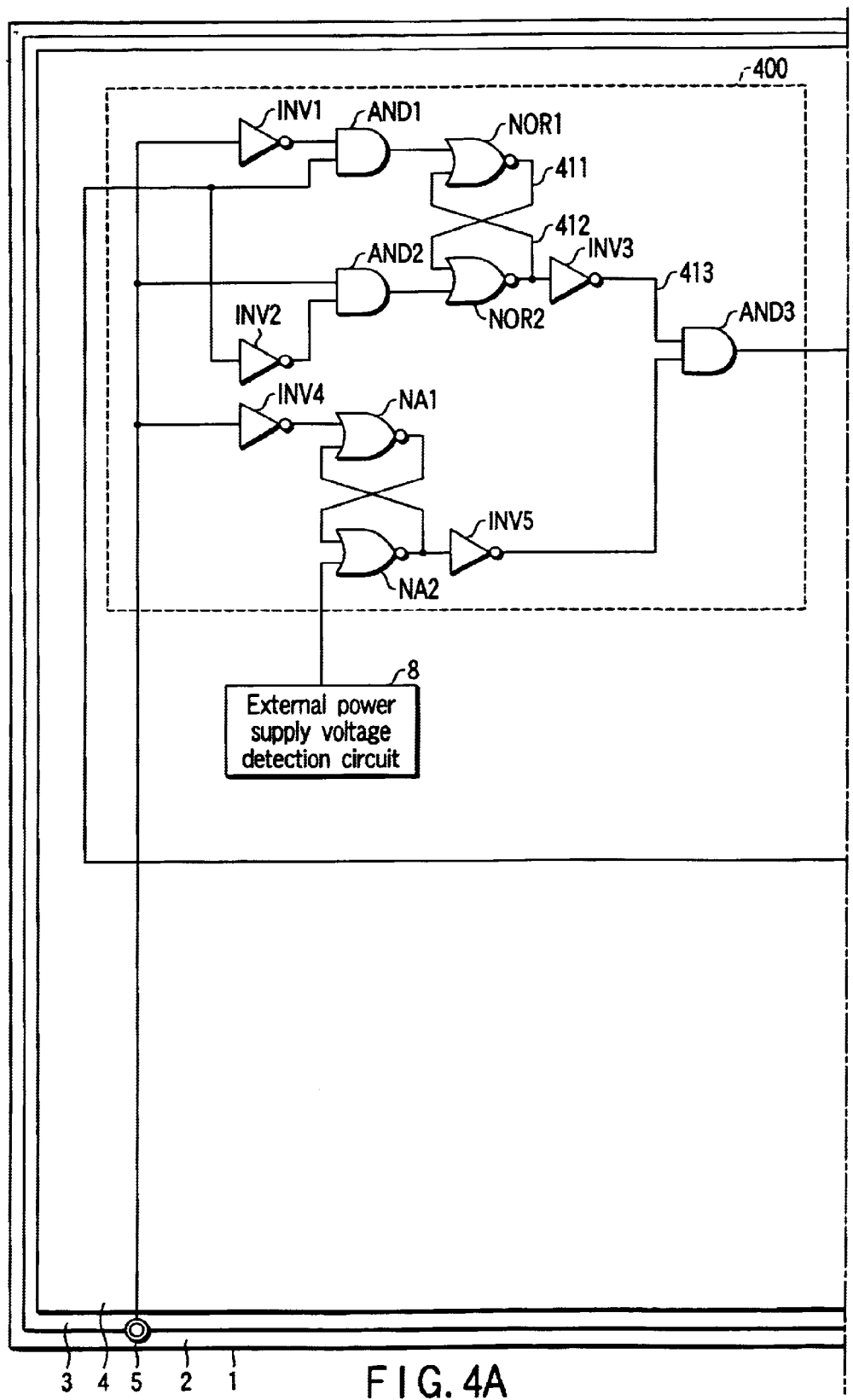
FIGS. 4A and 4B are block diagrams for showing a memory-embedded logic LSI according to a third embodiment.
Figure 4B:
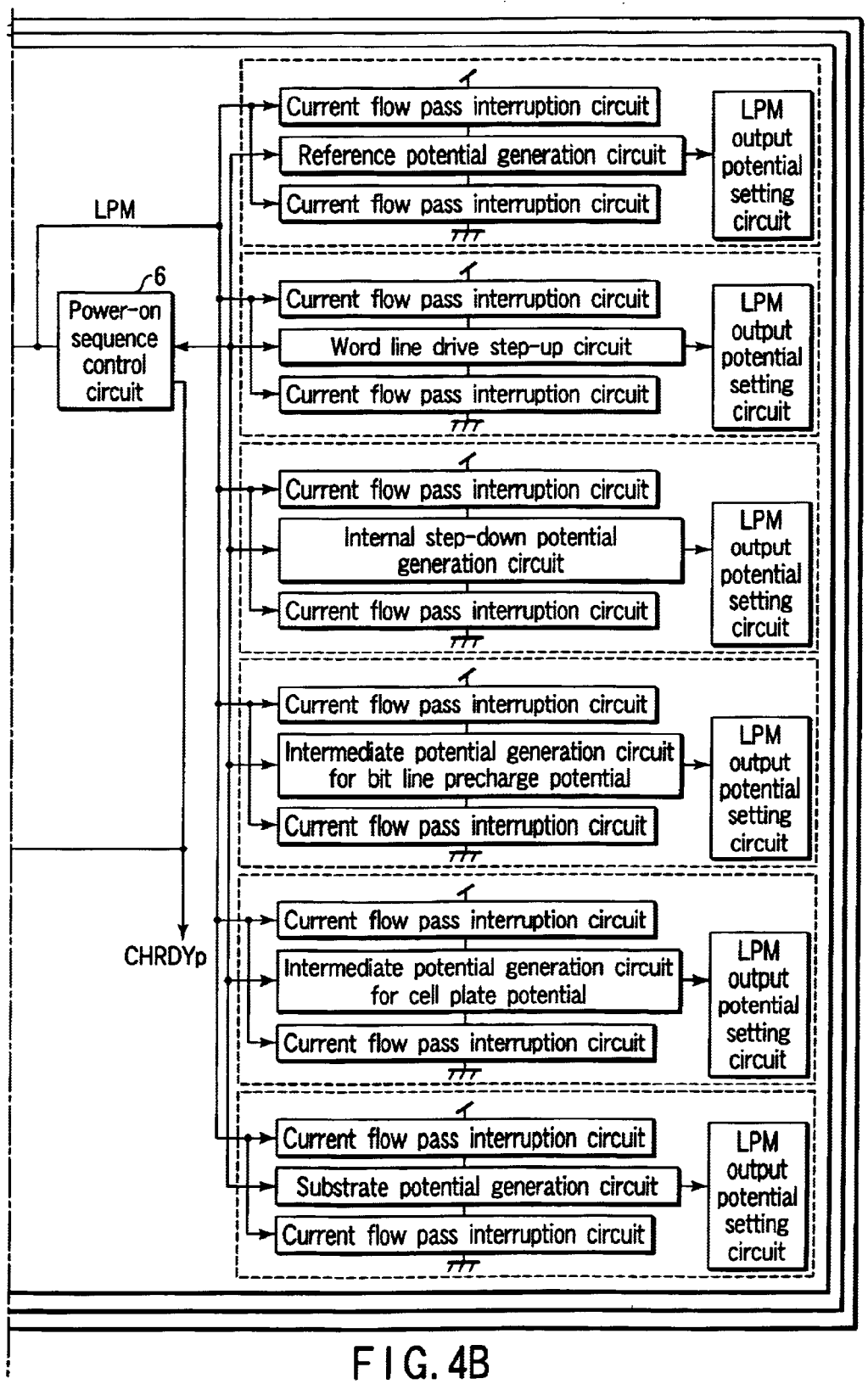
Figure 5:
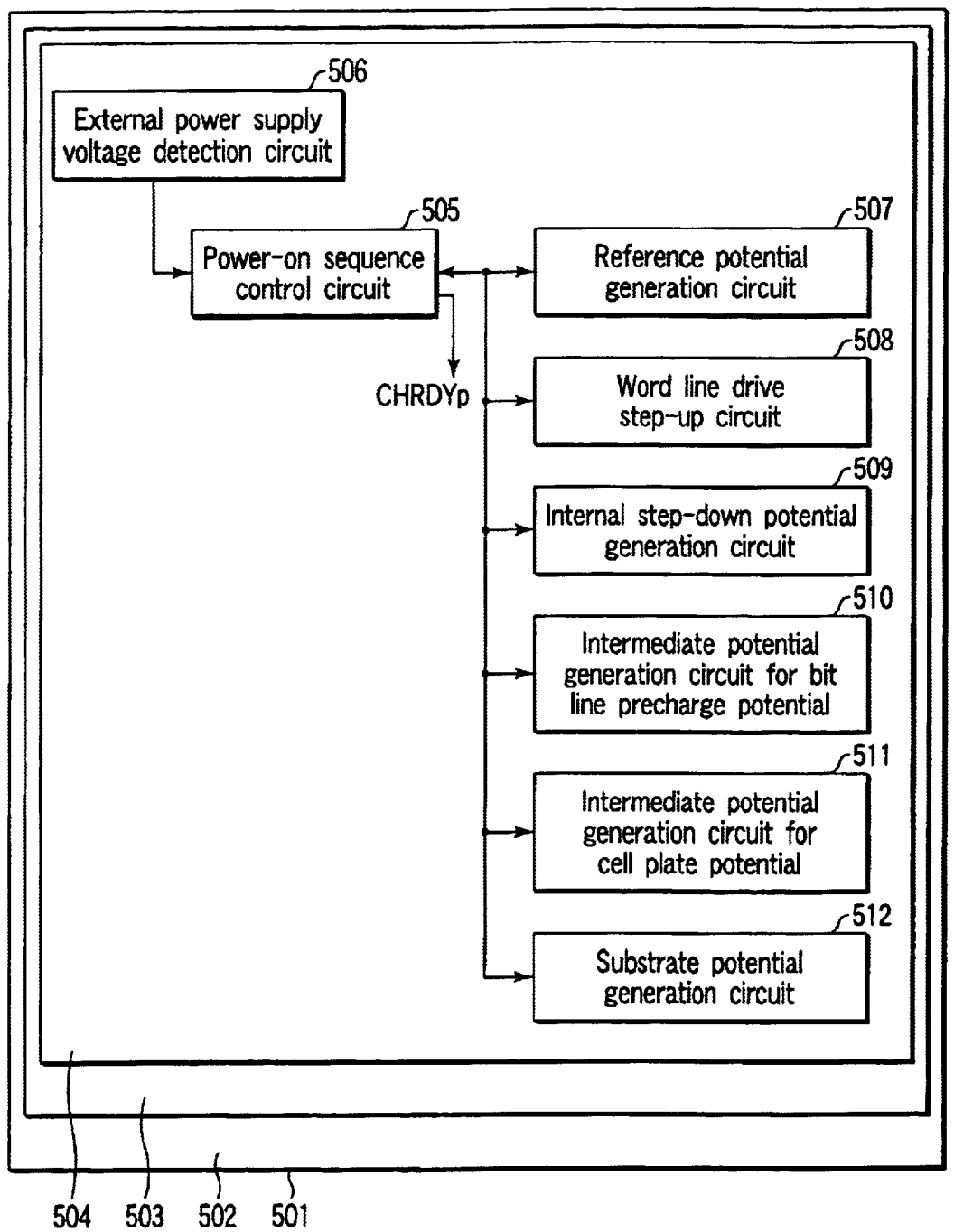
FIG. 5 is a block diagram for showing a conventional memory-embedded logic LSI.

Next, FIGS. 4A and 4B show block diagrams of a memory-embedded logic LSI according to the third embodiment.

The third embodiment is the same as the second embodiment except that it has an LPM reset circuit 400 as shown in FIG. 4A in place of the LPM reset circuit 300 of the second embodiment shown in FIG. 3A and so its explanation is omitted. Furthermore, the connection of a latch circuit provided by AND1, AND2, INV1–INV3, NOR1, and NOR2 of the LPM reset circuit 400 is the same as that of the LPM reset circuit 300 and so its explanation is omitted.

NA1 and NA2 provide a latch circuit. That is, the LPM signal is input to NA1 via INV4 and an output of the external power supply voltage detection circuit 8 is input to NA2. An output of NA2 is connected via INV5 to one of the two inputs of AND3, to the other input of which an output of the latch circuit of NOR1 and NOR2 is connected via INV3. An output of AND3 provides the LPM reset signal, which is input to the power-on sequence control circuit 6 and each of the internal potential generation circuits.

The following will describe the operation of the LPM reset circuit 400 upon power application.

If the LPM signal is at the HIGH level upon power application, a signal node 413, at which an output of the latch circuit comprised of NOR1 and NOR2 is inverted, becomes HIGH in level as in the case of the second embodiment, which is applied to one of the two inputs of AND3. Also, an output of the latch circuit comprised of NA1 and NA2 is fixed at the LOW level, which is inverted by INV5 to provide the HIGH level, which is in turn applied to the other of the two input terminals of AND3. AND3, therefore, outputs the HIGH level, so that the signal for specifying release is input to the power-on sequence control circuit 6 and each of the internal potential generation circuits, thus performing the same operations as those in the second embodiment.

If the LPM signal is fixed at the LOW level upon power application, on the other hand, the external power supply voltage detection circuit 8 is LOW in level until a constant voltage level is exceeded, so that the latch circuit of NA1 and NA2 provides a HIGH-level output. This signal is inverted by INV5 to provide the LOW level. Since the low level signal is input to AND3, the output of AND3 becomes the LOW-level. The signal for specifying the LPM is input to the power-on sequence control circuit 6 and each of the internal potential generation circuits. It is to be noted that even if the external power supply exceeds the constant level in voltage subsequently to thereby cause the external power supply voltage detection circuit 8 to output the HIGH level, the output of the latch circuit of NA1 and NA2 is kept at the HIGH level, so that the LPM will not be released. Accordingly, in this case the LPM cannot be released unless the LPM signal is given by HIGH in level.

In the third embodiment, therefore, even upon power application, it is possible to control the LPM of the memory macro 3 using the LPM signal.

It is to be noted that the LPM setting signal or the LPM releasing signal in the first through third embodiments may be produced in the logic circuit 2 and also may be input directly to the memory macro from the outside of the memory-embedded logic LSI in operation. The LPM setting input terminal 5, therefore, may be an internal or external terminal of the memory-embedded logic LSI.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general invention concept as defined by the appended claims and their equivalents.

What is claimed is:

1. A semiconductor integrated circuit comprising:
   an internal potential generation circuit for a memory;
   a current flow pass interruption circuit connected to the internal potential generation circuit; and
   an input terminal, connected to the current flow pass interruption circuit, for providing a stand-by setting signal controlling the current flow pass interruption circuit,
   wherein a potential is supplied to the internal potential generation circuit during the operation of the memory, and it is interrupted during the stand-by of the memory to supply the potential to the internal potential generation circuit.

2. The semiconductor integrated circuit according to claim 1, wherein the current flow pass interruption circuit includes first and second current flow pass interruption circuits, and the internal potential generation circuit is connected between the first and second current flow pass interruption circuits.

3. The semiconductor integrated circuit according to claim 2, further comprising a power supply line connected to the first current flow pass interruption circuit.

4. The semiconductor integrated circuit according to claim 2, wherein the second current flow pass interruption circuit is grounded.

5. The semiconductor integrated circuit according to claim 1, wherein the internal potential generation circuit includes a current flow pass having a comparator for controlling an output potential to a predetermined potential, and a resistance type voltage divider circuit for detecting a potential.

6. The semiconductor integrated circuit according to claim 5, wherein the current flow pass is disposed between the current flow pass interruption circuit and the internal potential generation circuit.

7. The semiconductor integrated circuit according to claim 1, further comprising an LPM output potential setting circuit connected to at least one of the internal potential generation circuits and fixing an output of the internal potential generation circuit during the stand-by of the memory.

8. A semiconductor integrated circuit comprising:
   a plurality of internal potential generation circuits for a memory;
   a current flow pass interruption circuit connected to each of the plurality of internal potential generation circuits; and
   an input terminal connected to each of said current flow pass interruption circuits, for providing a stand-by setting signal to control the current flow pass interruption circuits,
   wherein a potential is supplied to the plurality of internal potential generation circuits during the operation of the memory, and it is interrupted during the stand-by of the memory to supply the potential to the plurality of internal potential generation circuits.

9. The semiconductor integrated circuit according to claim 8, wherein the current flow pass interruption circuit includes first and second current flow pass interruption circuits, and each of the plurality of internal potential generation circuits is connected between the first and second current flow pass interruption circuits.

10. The semiconductor integrated circuit according to claim 9, further comprising a power supply line connected to the first current flow pass interruption circuit.

11. The semiconductor integrated circuit according to claim 10, wherein the second current flow pass interruption circuit is grounded.

12. The semiconductor integrated circuit according to claim 8, wherein each of the plurality of internal potential generation circuits includes a current flow pass comprising a comparator for controlling an output potential to a predetermined potential, and a resistance type voltage divider circuit for detecting a potential.

13. The semiconductor integrated circuit according to claim 8, wherein the current flow pass is disposed between the current flow pass interruption circuit and each of the plurality of internal potential generation circuits.

14. The semiconductor integrated circuit according to claim 8, further comprising an LPM output potential setting circuit connected to at least one of the internal potential generation circuits and fixing an output of the internal potential generation circuit during the stand-by of the memory.

15. The semiconductor integrated circuit according to claim 8, further comprising a selector connected to the input terminal and the plurality of internal potential generation circuits and selectively interrupting the supply of a potential to the plurality of internal potential generation circuits during the stand-by of the memory.

16. The semiconductor integrated circuit according to claim 8, further comprising a power-on sequence control circuit, connected between the input terminal and the plurality of internal potential generation circuits, for controlling a sequence of the plurality of internal potential generation circuits when said memory is released from the LPM.

17. A semiconductor integrated circuit comprising:
an internal potential generation circuit for a memory;
a current flow pass interruption circuit connected to the internal potential generation circuit;
a power-on sequence control circuit connected to the internal potential generation circuit;
an external power supply voltage detection circuit for detecting an external power supply to output a detection signal;
an LPM reset circuit connected to the external power supply voltage detection circuit, the power-on sequence control circuit and the internal potential generation circuit, respectively; and
an input terminal connected to the LPM reset circuit,
wherein an LPM reset signal is produced in the LPM reset circuit by at least two signals selected from the group consisting of the detection signal, a stand-by setting signal input from the input terminal and a signal output from the power-on sequence control circuit and specifying an operable state of the memory, and in accordance with the LPM reset signal, a potential is supplied from a power supply to the internal potential generation circuit during the operation of the memory and it is interrupted during the stand-by of the memory to supply the potential from the power supply to the internal potential generation circuit.

18. The semiconductor integrated circuit according to claim 17, wherein the current flow pass interruption circuit includes first and second current flow pass interruption circuits, and the internal potential generation circuit is connected between the first and second current flow pass interruption circuits.

19. The semiconductor integrated circuit according to claim 18, further comprising a power supply line connected to the first current flow pass interruption circuit.

20. The semiconductor integrated circuit according to claim 19, wherein the second current flow pass interruption circuit is grounded.

21. The semiconductor integrated circuit according to claim 17, wherein the internal potential generation circuit includes a current flow pass having a comparator for controlling an output potential to a predetermined potential, and a resistance type voltage divider circuit for detecting a potential.

22. The semiconductor integrated circuit according to claim 21, wherein said current flow pass is disposed between the current flow pass interruption circuit and the internal potential generation circuit.

* * * * *